United States Patent [19]

Partovi et al.

[11] Patent Number: 5,508,640
[45] Date of Patent: Apr. 16, 1996

[54] DYNAMIC CMOS LOGIC CIRCUIT WITH PRECHARGE

[75] Inventors: Hamid Partovi, Westboro, Mass.; Donald A. Draper, San Jose, Calif.

[73] Assignee: Intergraph Corporation, Huntsville, Ala.

[21] Appl. No.: 121,136

[22] Filed: Sep. 14, 1993

[51] Int. Cl.⁶ .................. H03K 19/017; H03K 19/0948
[52] U.S. Cl. .................. 326/98; 326/97; 326/122
[58] Field of Search .................. 307/452, 481, 307/480, 451, 279; 326/121, 122, 97, 98

[56] References Cited

U.S. PATENT DOCUMENTS

| | | | |
|---|---|---|---|
| 3,753,010 | 8/1973 | Haraszti | 307/279 |
| 4,099,265 | 7/1978 | Abe | 307/279 |
| 4,112,296 | 9/1978 | Heimbigner et al. | 307/279 |
| 4,367,420 | 1/1983 | Foss et al. | 326/98 |
| 4,575,648 | 3/1986 | Lee | 326/115 |
| 4,654,547 | 3/1987 | Shaver | 307/279 |
| 4,779,010 | 10/1988 | Moss | 307/452 |
| 4,883,989 | 11/1989 | Mizukami | 307/452 |
| 4,899,066 | 2/1990 | Aikawa et al. | 307/452 |
| 5,153,451 | 10/1992 | Yamamura et al. | 307/279 |

FOREIGN PATENT DOCUMENTS

| | | |
|---|---|---|
| 0440514A2 | 8/1991 | European Pat. Off. . |
| 0469787A1 | 2/1992 | European Pat. Off. . |

*Primary Examiner*—Edward P. Westin
*Assistant Examiner*—Richard Roseen
*Attorney, Agent, or Firm*—Townsend and Townsend and Crew

[57] ABSTRACT

A first transistor is connected to a second transistor so that the first and second transistors may be initially biased in a non-conducting state when a first node is at a first voltage potential and a second node is at a second voltage potential. A potential altering circuit selectively alters the voltage potential at the first and second nodes, causes the first and second transistors to be in a conducting state for accelerating a voltage transistion at the first and second nodes toward final values, and maintains the first and second nodes at their final voltage potentials for implementing a desired Boolean function.

23 Claims, 4 Drawing Sheets

DYNAMIC CMOS LOGIC CIRCUIT WITH PRECHARGE

BACKGROUND OF THE INVENTION

This invention relates to electronic circuits and, more particularly, to circuits which implement Boolean functions.

Many software and hardware applications require the implementation of Boolean functions such as AND, OR, NAND, NOR, EXCLUSIVE-OR, etc. Most Boolean functions may be implemented by interconnecting a plurality of transistors in such a way that binary signals representing input values are applied to control terminals of the transistors and the result of the logical expression is output from a node somewhere within the circuit. The circuits are often classified as static or dynamic. For example, FIG. 1 is a schematic diagram of a known static circuit 10 for implementing a NOR function $(\overline{A+B})$. Circuit 10 comprises PMOS transistors 14, 18 and NMOS transistors 22, 26. The binary signal representing the A value is applied to a gate terminal 30 of PMOS transistor 14 and to a gate terminal 32 of NMOS transistor 26. The binary signal representing the B value is applied to a gate terminal 34 of PMOS transistor 18 and to a gate terminal 38 of NMOS transistor 22. A source terminal 42 of PMOS transistor 14 is coupled to a $V_{DD}$ potential, and a drain terminal 46 of PMOS transistor 14 is coupled to a source terminal 50 of PMOS transistor 18 at a node 54. A drain terminal 58 of PMOS transistor 18 is coupled to an $(\overline{A+B})$ output line 62 at a node 64. Drain terminals 68, 72 of NMOS transistors 22, 26 respectively are coupled to $(\overline{A+B})$ output line 62 at respective nodes 76 and 78. Source terminals 82, 84 of NMOS transistors 22 and 26, respectively are coupled to a ground potential. From inspection of circuit 10, it should be readily apparent that when both A and B are low, then transistors 14 and 18 conduct current into node 64. At this time transistors 22 and 26 are nonconducting. Thus, output line 62 is pulled high. On the other hand, if either A or B are high, then the respective PMOS transistor 14 or 18 is rendered nonconducting. Simultaneously, one or both of NMOS transistors 22 or 26 conducts current away from node 64, and output line 62 is pulled low.

One problem with circuit 10 is that, since PMOS transistors are not as conductive as NMOS transistors for a given size, PMOS transistors 14 and 18 typically must have a considerably larger size than transistors 22 and 26. Not only does this consume valuable chip area, but the logic elements which generate the A and B signals must therefore drive more input capacitance. Another problem, shared by all static circuits of this type (and those described below), is that half the circuit becomes nonconducting at any transition (e.g., when A and B go high, PMOS transistors 14, 18 are off and NMOS transistors 22, 26 are on). The nonconducting transistors act as an unnecessary load to the inputs as well as the outputs. Furthermore, the series connection of PMOS transistors 14 and 18 creates unwanted delay through the circuit. Since there must be a series connected PMOS transistor for every input signal, the complexity and delay of the circuit becomes unacceptable very quickly as the number of inputs increase. The same would be true for a NAND circuit although in that case delay and complexity would be caused by serially connected NMOS transistors.

FIG. 2 is a schematic diagram of a circuit 100 which attempts to overcome the problems of circuit 10 shown in FIG. 1. Circuit 100 comprises PMOS transistors 104, 108 and NMOS transistors 120, 122, 124 and 126. The A input signal is applied to a gate terminal 128 of NMOS transistor 120, and the B input signal is applied to a gate terminal 130 of NMOS transistor 122. The complement of the A input signal is applied to a gate terminal 132 of NMOS transistor 124, and the complement of the B input signal is applied to a gate terminal 134 of NMOS transistor 126. A source terminal 138 of PMOS transistor 104 is coupled to $V_{DD}$, and a drain terminal 140 of PMOS transistor 104 is coupled to an $(\overline{A+B})$ output line 144 at a node 142. A source terminal 146 of PMOS transistor 108 is also coupled to $V_{DD}$, and a drain terminal 148 of PMOS transistor 108 is coupled to an $(A+B)$ output line 152 at a node 150. A gate terminal 154 of PMOS transistor 104 is coupled to node 150, and a gate terminal 158 of PMOS transistor 108 is coupled to node 142.

Drain terminals 160, 162 of NMOS transistors 120 and 122, respectively, are coupled to $(\overline{A+B})$ output line 144 at respective nodes 164 and 142. Source terminals 168, 170 of NMOS transistors 120 and 122, respectively are coupled to a ground potential. A drain terminal 172 of NMOS transistor 124 is coupled to node 150, and a source terminal 174 of NMOS transistor 124 is coupled to a drain terminal 176 of NMOS transistor 126 at a node 180. A source terminal 184 of NMOS transistor 126 is coupled to a ground potential.

When either A or B are high, then one or both of NMOS transistors 120 or 122 conduct current away from their respective nodes 164 or 142, which tends to pull $(\overline{A+B})$ output line 144 low. Additionally, one or more of NMOS transistors 124 or 126 are rendered nonconducting and prevent current flow away from node 150. As node 142 is pulled low, PMOS transistor 108 begins conducting current into node 150, thus pulling $(A+B)$ output line 152 high. The high signal at node 150 renders transistor 104 nonconducting, and the circuit reaches a final state where $(\overline{A+B})$ output line 144 is low and $(A+B)$ output line 152 is high. If both A and B are low, then NMOS transistors 120 and 122 are both rendered nonconducting and NMOS transistors 124 and 126 conduct current away from node 152. The result is then a high signal at $(\overline{A+B})$ output line 144 and a low signal at $(A+B)$ output line 152.

While circuit 100 eliminates the serially connected stack of PMOS transistors shown in circuit 10 of FIG. 1, it is not without its own disadvantages. For example, circuit 100 requires both the A and B signals and their complements as inputs, thus requiring an inverter stage between NMOS transistors 120, 122 and NMOS transistors 124, 126. This, in turn, adds delay to the circuit and doubles interconnect routing as the inverted signals are fed to their corresponding inputs. Also, there must be as many serially coupled NMOS transistors coupled to node 150 as there are inputs, thus providing further delay in the circuit operation. Furthermore, circuit 100 relies on NMOS transistors 120, 122 to overcome any current flow from PMOS transistor 104 to pull $(\overline{A+B})$ output line 144 low and change the existing state of the circuit when PMOS transistor 104 is conducting and PMOS transistor 108 is nonconducting. Similarly, NMOS transistors 124 and 126 must overcome any current flow from PMOS transistor 108 to pull $(A+B)$ output line 152 low and change the existing state of the circuit when PMOS transistor 104 is nonconducting and PMOS transistor 108 is conducting. The fight between the PMOS transistors attempting to pull up their respective nodes and the NMOS transistors attempting to pull down their respective nodes prevents the circuit from responding quickly to input signal transitions. Thus, on the one hand, one cannot size PMOS transistors 104 and 108 too large or else they may prevent NMOS transistors 120 and 122 or NMOS transistors 124 and 126 from performing their function. On the other hand, PMOS transistors 104 and 108 cannot be sized too small or else any high signal on $(\overline{A+B})$ output line 144 or (A+B) output line 152 will take too long to generate.

FIG. 3 is a schematic diagram of a circuit 200 which attempts to overcome some of the problems of circuit 100 shown in FIG. 2. Circuit 200 is an improvement of circuit 100, and the components which remain the same are numbered identically. Briefly, circuit 200 is the same as circuit 100 with the addition of NMOS transistors 204, 208, 212 and 216. The complement of the A input signal is applied to a gate terminal 220 of NMOS transistor 204, the complement of the B input signal is applied to a gate terminal 224 of NMOS transistor 208, the A input signal is applied to a gate terminal 228 of NMOS transistor 212, and the B input signal is applied to a gate terminal 232 of NMOS transistor 216 for reasons discussed below. A drain terminal 236 of NMOS transistor 204 is coupled to $V_{DD}$, and a source terminal 240 of NMOS transistor 204 is coupled to a drain terminal 242 of NMOS transistor 208 at a node 244. A source terminal 248 of NMOS transistor 208 is coupled to ($\overline{A+B}$) output line 144 at a node 250. Drain terminals 254, 256 of NMOS transistors 212, 216, respectively, are coupled to $V_{DD}$, and source terminals 258 and 260 of NMOS transistors 212, 216, respectively, are coupled to A+B output line 152 at respective nodes 262 and 264.

If A or B is high, then one or both of NMOS transistors 204 or 208 are nonconducting, and $(\overline{A+B})$ output line 144 is pulled low by whichever NMOS transistor 120 or 122 is conducting at the time. This tends to turn on PMOS transistor 108. At the same time, one or both of NMOS transistors 124 or 126 are nonconducting while one or both of NMOS transistors 212 or 216 are conducting current into (A+B) output line 152, thus aiding PMOS transistor 108 in pulling (A+B) output line 152 high. On the other hand, if A and B are both low, then NMOS transistors 212, 216 are nonconducting, and (A+B) output line 152 is pulled low by NMOS transistors 124, 126. This tends to turn on PMOS transistor 104. At the same time, NMOS transistors 120, 122 are nonconducting, while NMOS transistors 204, 208 conduct current into $(\overline{A+B})$ output line 152, thus aiding PMOS transistor 104 in pulling $(\overline{A+B})$ output line 144 high. While the addition of NMOS transistors 204, 208, 212, and 216 may overcome the sizing limitations of PMOS transistors 104 and 108, they do not eliminate the requirement of generating both the original input signal and its complement, and serially connected NMOS transistors (one per input) must still be coupled to node 150. In fact, circuit 200 exacerbates the problem by adding serially connected NMOS transistors 204, 208 to node 250. Furthermore, the added transistors 204, 208, 212 and 216 consume additional chip area.

FIG. 4 is a schematic diagram of a dynamic circuit 300 which attempts to overcome the problems noted in circuits 10, 100 and 200. Circuit 300 comprises a PMOS transistor 304, NMOS transistors 308, 312, 316 and an inverter 320. The A input signal is applied to a gate terminal 324 of NMOS transistor 308, and the B input signal is applied to a gate terminal 328 of NMOS transistor 312. A precharge signal is applied to a gate terminal 332 of PMOS transistor 304 and to a gate terminal 336 of NMOS transistor 316. A source terminal 340 of PMOS transistor 304 is coupled to $V_{DD}$, and a drain terminal 344 of PMOS transistor 304 is coupled to an input terminal 348 of inverter 320 at a node 352. An output terminal of inverter 320 functions as an (A+B) output line 356. Drain terminals 360, 364 of NMOS transistors 308, 312, respectively, are coupled to node 352, and source terminals 368, 372 of NMOS transistors 308, 312 are coupled to a drain terminal 376 of NMOS transistor 316 at a node 380. A source terminal 384 of NMOS transistor 316 is coupled to a ground potential.

In operation, a low signal is applied to gate 332 of PMOS transistor 304 and to gate terminal 336 of NMOS transistor 316 during a precharge cycle, thus rendering PMOS transistor 304 conductive while rendering NMOS transistor 316 non-conductive. This, in turn, allows node 352 to be precharged to a high potential regardless of the state of the A and B input signals applied to gate terminals 324, 328 of NMOS transistors 308, 312, respectively. Thereafter, a high signal is applied to gate 332 of PMOS transistor 304 and to gate terminal 336 of NMOS transistor 316 during an evaluate cycle, thus rendering PMOS transistor 306 non-conductive and rendering NMOS transistor 316 conductive. If one or both of the A or B signals are high, then one or both of NMOS transistors 308 or 312 are rendered conductive, thus pulling node 352 low, which results in a high signal on (A+B) output line 356. On the other hand, if both A and B are low, then NMOS transistors 308 and 312 remain non-conductive, node 352 remains at a high potential, and a low signal remains on (A+B) output line 356. While circuit 300 overcomes some of the problems of the previous discussed circuits, such as one set of transistors attempting to overcome the operation of another set of transistors, it too has disadvantages. For example, FIG. 5 shows a series of NMOS transistors 410A, 410B, . . . , 410N, each having their drain terminals 412A, 412B, . . . , 412N coupled to an input terminal 414 of an inverter 416 at respective nodes 418A, 418B, . . . , 418N. Source terminals 420A, 420B, . . . , 420N are coupled to a ground potential or to some other current sink. A precharge circuit 424 is coupled to input terminal 414 at a node 426 for precharging input terminal 414 to a high potential as with input terminal 348 of circuit 300.

As is known in the art, inverter 416 has a capacitance 430 associated with it, and each NMOS transistor 410A, 410B, . . . , 410N has respective capacitances 434A, 434B, . . . , 434N, associated with it. When the number of NMOS transistors are small, then capacitance 430 associated with inverter 416 is the primary capacitance in the system and it is easily precharged by precharge circuit 424 and discharged by the NMOS transistors. However, as the number of NMOS transistors become large, the aggregate capacitances associated with the plurality of NMOS transistors becomes so large that it becomes the dominant capacitance and degrades performance to an unacceptable level as individual NMOS transistors attempt to discharge the very large capacitance. The problem cannot be solved by increasing the size of the NMOS transistors, because then the associated capacitances also increase.

SUMMARY OF THE INVENTION

The present invention is directed to a family of high-speed, compact logic gates which lends itself well to more complex logic. The circuit accommodates any number of inputs while minimizing size or delay through the circuit. In one embodiment of the present invention, a first transistor is connected to a second transistor so that the first and second transistors may be initially biased in a non-conducting state when a first node is at a first voltage potential and a second node is at a second voltage potential. A potential altering circuit selectively alters the voltage potential at the first and second nodes, causes the first and second transistors to be in a conducting state for accelerating a voltage transition at the first and second nodes toward final values, and maintains the first and second nodes at their final voltage potentials for implementing a desired Boolean function. More specifically, a first transistor has a first current flowing terminal coupled to a first voltage potential and a second current flowing terminal coupled to a first node. A second transistor has a first current flowing terminal coupled to a second voltage potential and a second current flowing terminal coupled to a second node. A control terminal of the first transistor is coupled to the second node, and a control terminal of the second transistor is coupled to the first node. A biasing circuit is coupled to the first and second nodes for initializing the first node to a third voltage potential and for initializing the second node to a fourth voltage potential. A potential altering circuit is coupled to the first and second nodes for selectively altering the voltage potential at the first and second nodes. When the voltage potential at the first and second nodes are altered, the first and second transistors become conductive and accelerate the voltage transistion at the first and second nodes toward their final values.

DESCRIPTION OF THE PREFERRED EMBODIMENT

Figure 6:
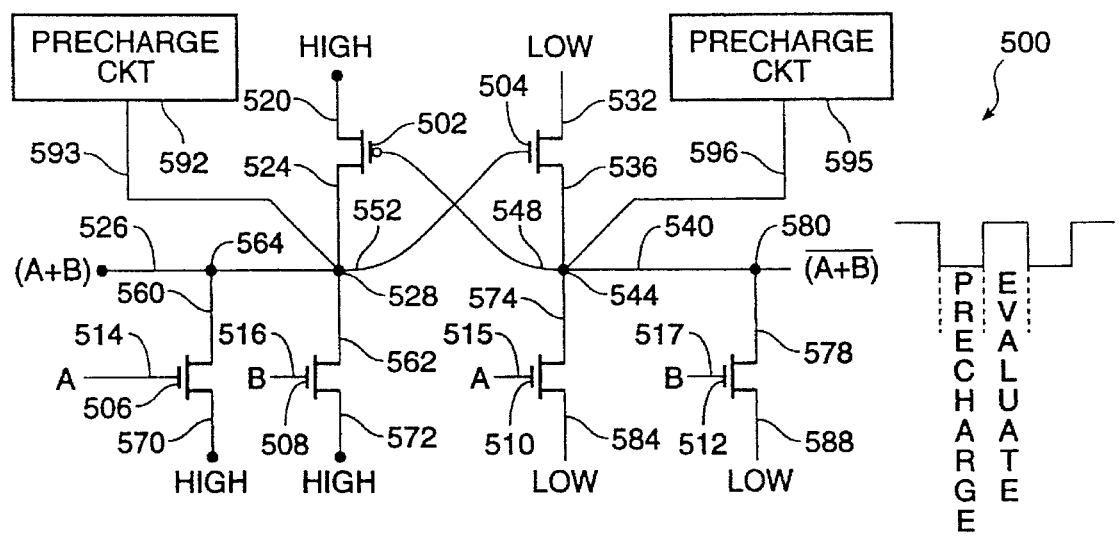
FIG. 6 is a schematic diagram of a particular embodiment of a logic circuit according to the present invention for implementing an OR/NOR function.

FIG. 6 is a schematic diagram of a particular embodiment of a logic circuit 500 according to the present invention for implementing an OR/NOR function.

Circuit 500 comprises a PMOS transistor 502 and an NMOS transistor 504. Circuit 500 also comprises NMOS transistors 506, 508, 510 and 512. An A input signal is applied to gate terminals 514, 515 of NMOS transistors 506, 510 respectively, and a B input signal is applied to gate terminals 516, 517 of NMOS transistors 508, 512, respectively. PMOS transistor 502 has a source terminal 520 coupled to a high voltage potential and a drain terminal 524 coupled to an (A+B) output line 526 at a node 528. NMOS transistor 504 has a source terminal 532 coupled to a low voltage potential and a drain terminal 536 coupled to an ($\overline{A+B}$) output line 540 at a node 544. As used herein, a high voltage potential may be any potential above the voltage threshold of the transistor to which it is coupled to and may be, for example, $V_{DD}$. A low voltage potential may be any voltage potential below the voltage threshold of the transistor to which it is connected and may be, for example, a ground potential. A gate terminal 548 of PMOS transistor 502 is coupled to node 544, and a gate terminal 552 of NMOS transistor 504 is coupled to node 528.

Figure 1:
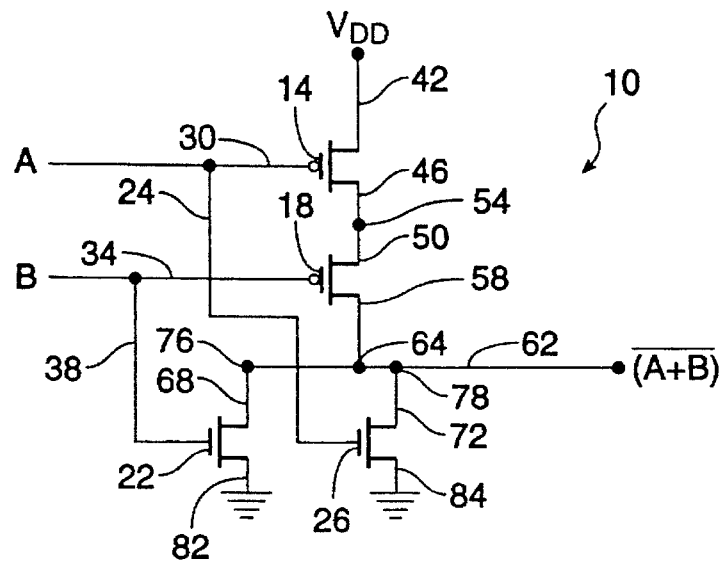
FIGS. 1–4 are schematic diagrams showing alternative embodiments of prior art circuits for implementing a Boolean function.
Figure 2:
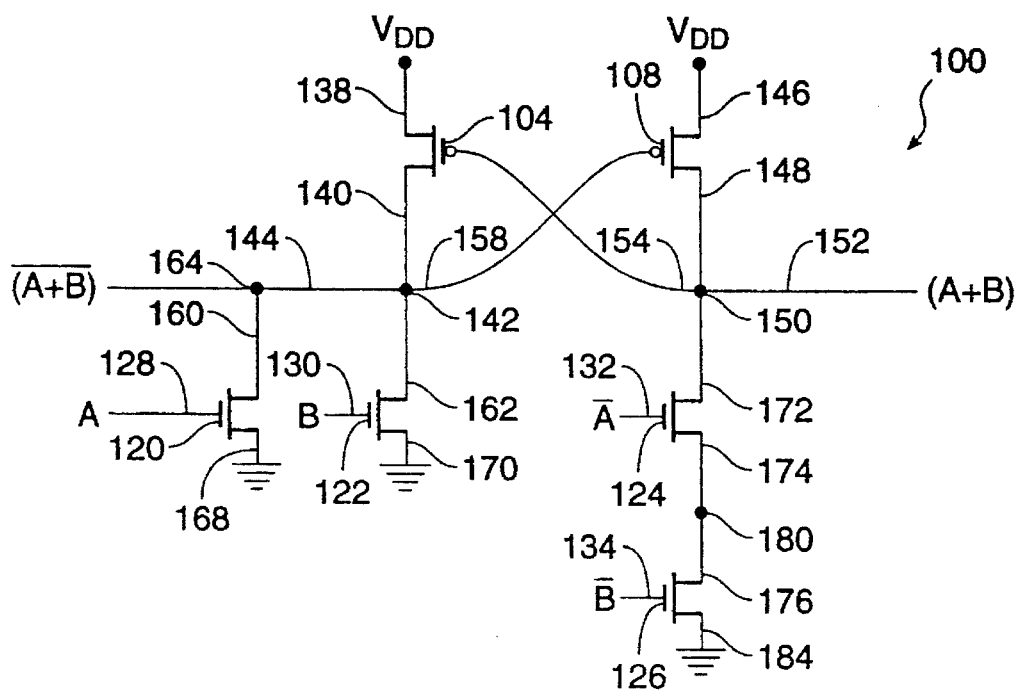
Figure 3:
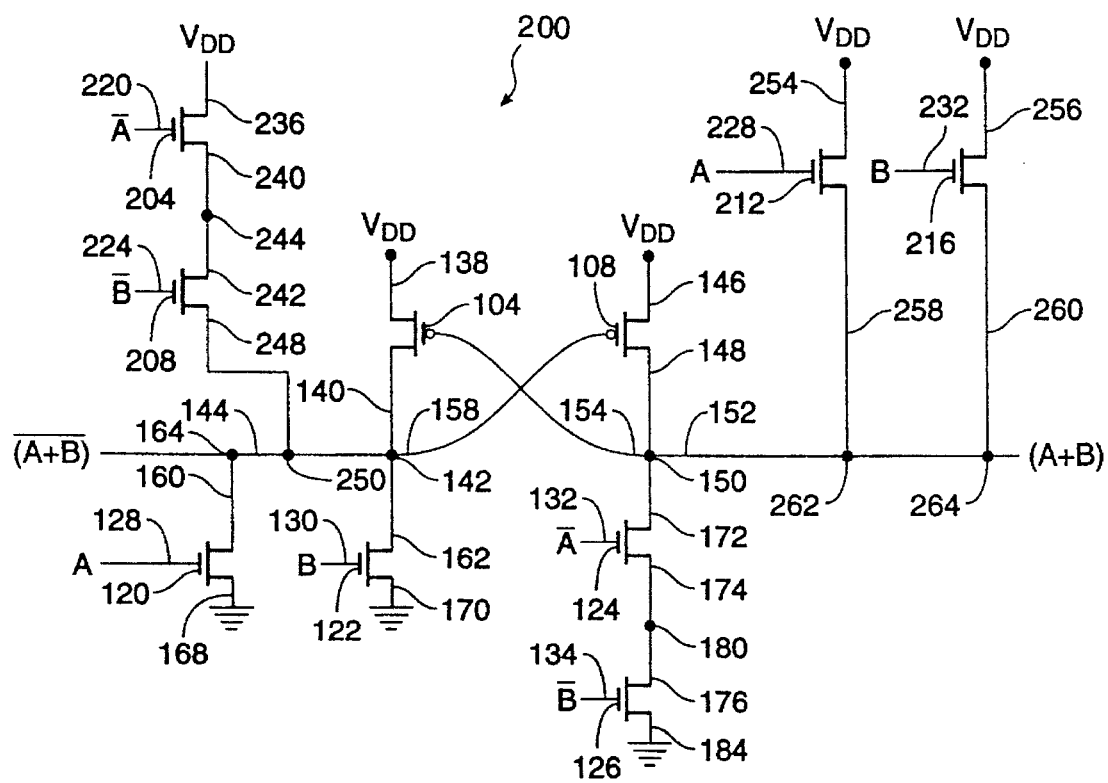
Figure 4:
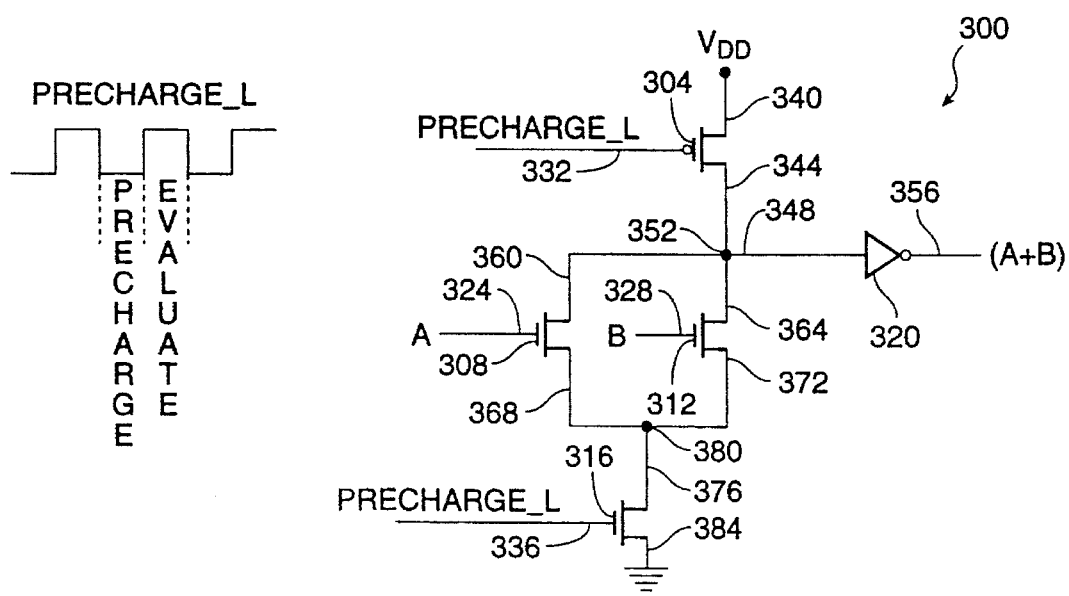

NMOS transistors 506, 508 each have source terminals 560, 562, respectively, coupled to (A+B) output line 526 at respective nodes 564 and 528, and drain terminals 570, 572 coupled to the high voltage potential. NMOS transistors 510 and 512 each have drain terminals 574, 578, respectively, coupled to ($\overline{A+B}$) output line 540 at respective nodes 544 and 580, and source terminals 584 and 588 coupled to the low voltage potential. A precharge or initializing circuit 592 is coupled to node 528 through a line 593 for initializing node 528 to a low voltage potential, and a precharge circuit 595 is coupled to node 544 through a line 596 for initializing node 544 to a high voltage potential. If desired, a transistor may be coupled in series with NMOS transistors 506, 508, 510 and 512 much like NMOS transistor 316 in FIG. 4 to guarantee the integrity of the precharge operation.

In operation precharge circuit 592 initializes node 528 to a low voltage potential, and precharge circuit 595 initializes node 544 to a high voltage potential during a precharge cycle. Thereafter, NMOS transistors 506, 508, 510 and 512 are selectively rendered conductive during an evaluate cycle by the A and B input signals applied to their respective gates. If one or both of the A and B signals are high, then one or both of NMOS transistors 506 or 508 are rendered conductive, and one or both of NMOS transistors 510 and 512 are rendered conductive. As a result, the voltage potential at node 528 rises, and the voltage potential at node 544 falls. When the potential at node 528 rises to the threshold voltage of NMOS transistor 504, then NMOS transistor 504 begins conducting and accelerates ($\overline{A+B}$) output line 540 to a low voltage potential. Similarly, when the voltage at node 544 falls to the voltage threshold of PMOS transistor 502, then PMOS transistor 502 begins conducting and accelerates (A+B) output line 526 to a high voltage potential. The resulting signals at nodes 528 and 544 latch PMOS transistor 502 and NMOS transistor 504 in a conducting state and maintains nodes 528 and 544 in their final high and low states, respectively.

It should be noted that circuit 500 operates by turning on both PMOS transistor 502 and NMOS transistor 504 from an initial non-conductive state. Once the threshold voltage of PMOS transistor 502 and NMOS transistor 504 is reached, PMOS transistor 502 and NMOS transistor 504 are essentially decoupled from NMOS transistors 506, 508, 510 and 512 and work independently of those transistors. Since NMOS transistors 506, 508, 510 and 512 do not have to overcome current flow from either PMOS transistor 502 or NMOS transistor 504, PMOS transistor 502 and NMOS transistor 504 may be fabricated in any desired size. For example, PMOS transistor 502 and NMOS transistor 504 may be sized large enough to overcome self-loading of a circuit having a large number of input transistors. Additionally, all the input transistors are coupled in parallel, so the delay inherent in the serially coupled transistors of prior art circuits is eliminated. Finally, since the circuit changes state simply by charging node 528 and discharging node 544, very little net current flows through the circuit, thus making the circuit very efficient.

Figure 7:
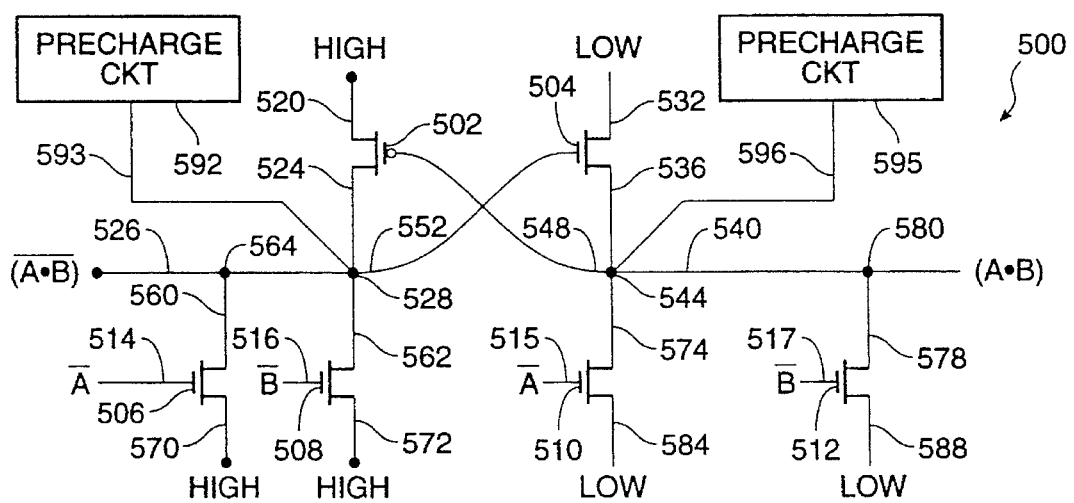
FIG. 7 is a schematic diagram of a particular embodiment of a logic circuit according to the present invention for implementing an AND/NAND function.

FIG. 7 is a schematic diagram of a particular embodiment of a logic circuit 600 according to the present invention for implementing an AND/NAND function. The circuit elements which are the same as OR/NOR circuit 500 are labeled the same. From inspection, it is readily apparent that the circuit is constructed the same, except the complement of the A and B input signals are used (because a NAND gate is the same as an OR gate with inverted inputs). The circuit operates the same as circuit 500 except ($\overline{A*B}$) appears on line 526 and (A*B) appears on line 540.

Figure 5:
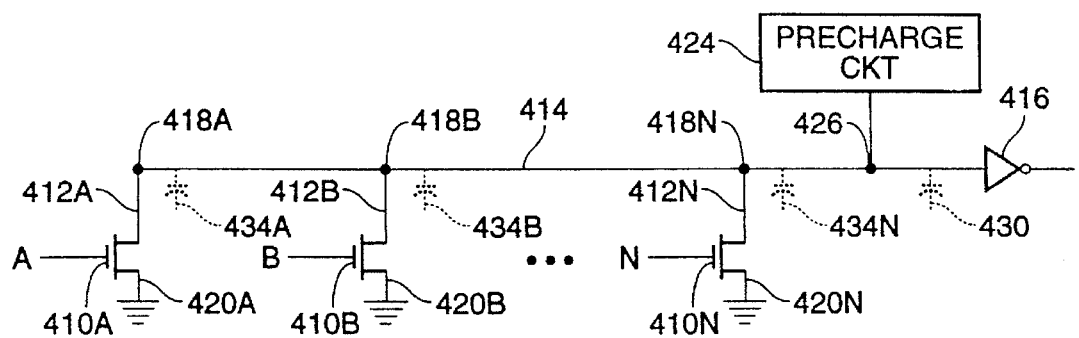
FIG. 5 is a schematic diagram of a known comparator circuit.
Figure 8:
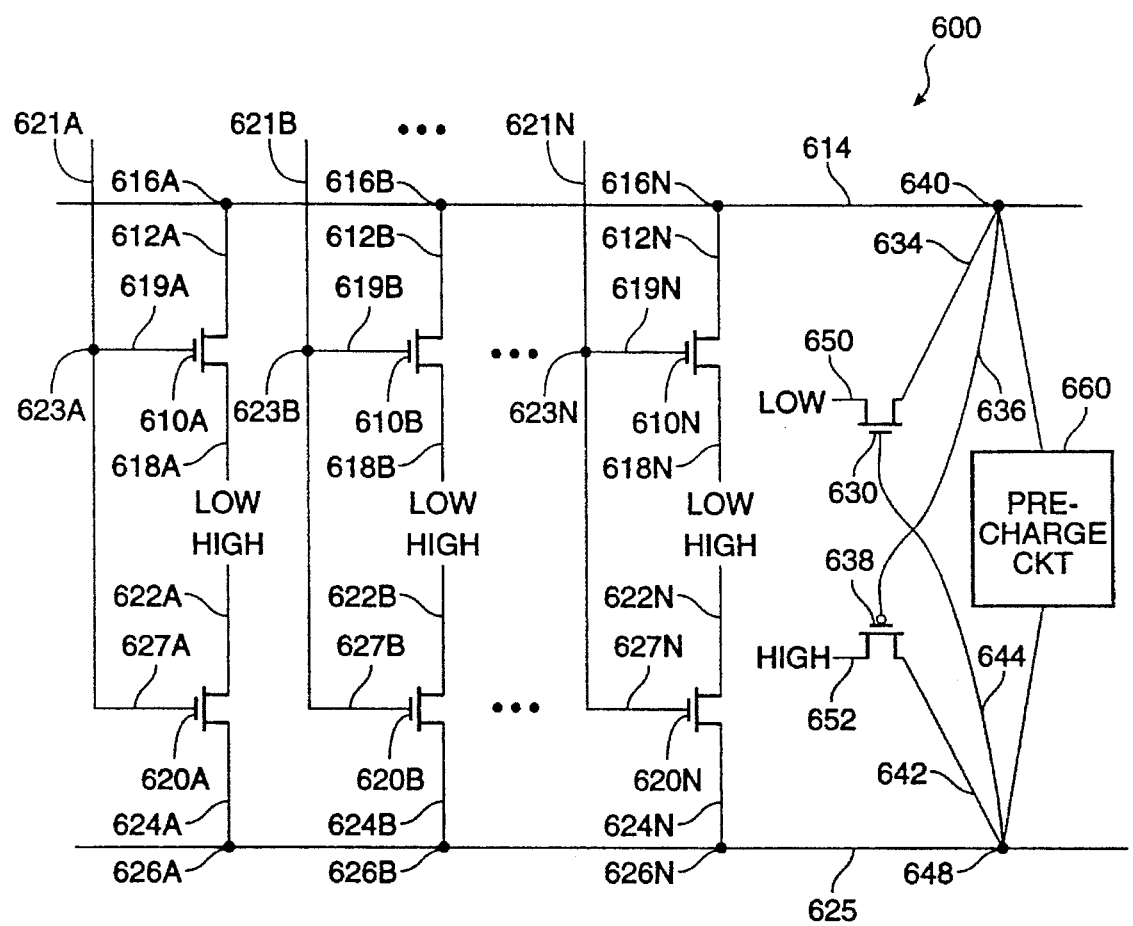
FIG. 8 is a schematic diagram of a particular embodiment of a comparator according to the present invention.

FIG. 8 is a schematic diagram of particular embodiment of a circuit 600 according to the present invention which avoids the problem of self-loading experienced with the circuit shown in FIG. 5. Circuit 600 includes a plurality of NMOS transistors 610A, 610B, . . . , 610N, each having their drain terminals 612A, 612B, . . . , 612N coupled to a line 614 at respective nodes 616A, 616B, . . . , 616N, their source terminals 618A, 618B, . . . , 618N coupled to a low voltage potential, and their gate terminals 619A, 619B, . . . , 619N coupled to respective signal lines 621A, 621B, . . . , 621N at respective nodes 623A, 623B, . . . , 623N. A plurality of NMOS transistors 620A, 620B, . . . , 620N have their drain terminals 622A, 622B, . . . , 622N coupled to a high voltage potential, their source terminals 624A, 624B, . . . , 624N coupled to a line 625 at respective nodes 626A, 626B, . . . , 626N, and their gate terminals 627A, 627B, . . . , 627N coupled to nodes 623A, 623B, . . . , 623N, respectively.

An NMOS transistor 630 has a drain terminal 634 coupled to line 614 and to a gate terminal 636 of a PMOS transistor 638 at a node 640. A PMOS transistor 638 has a drain terminal 642 coupled to line 625 and to a gate terminal 644 of NMOS transistor 630 at a node 648. A source terminal 650 of NMOS transistor 630 is coupled to a low voltage potential, and a source terminal 652 of PMOS transistor 638 is coupled to a high voltage potential. A precharge circuit 660 has a first precharge line 664 coupled to node 640 and a second precharge line 668 coupled to node 648.

In operation, precharge circuit 660 precharges node 640 to a high voltage potential and precharges node 648 to a low voltage potential during the precharge cycle. If one or more of the signals on lines 621A, 621B, . . . , 621N is high, then the NMOS transistors to which they are attached begin conducting. Consequently, the voltage at node 640 falls, and the voltage at node 648 rises. When the voltage at node 640 falls to the threshold voltage of PMOS transistor 638, then PMOS transistor 638 begins conducting and accelerates node 648 to a high voltage potential. Similarly, when the voltage at node 648 rises to the threshold voltage of NMOS transistor 630, then NMOS transistor begins conducting and accelerates node 640 to a low voltage potential. The resulting signals at nodes 640 and 648 latch NMOS transistor 630 and PMOS transistor 638 in a conducting state and maintains nodes 640 and 648 at their final low and high states, respectively.

Figure 9:
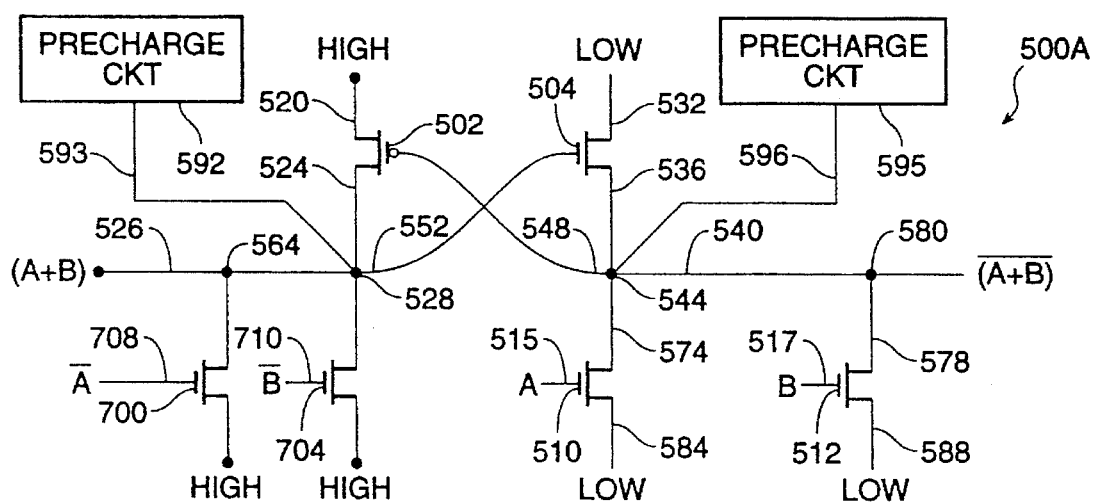
FIG. 9 is a schematic diagram of an alternative embodiment of the circuit shown in FIG. 6.

While the above is a complete description of one embodiment of the present invention, various modifications may be employed. For example, FIG. 9 is a schematic diagram of a circuit 500A similar to circuit 500 shown in FIG. 6. The only difference is the substitution of PMOS transistors 700 and 704 for NMOS transistors 506 and 508, respectively. Gate terminals 708, 710 receive the complements of the A and B input signals, respectively. The circuit operates in the same manner as circuit 500 in FIG. 6. Consequently, the scope of the invention should be ascertained by the following claims.

What is claimed is:

1. An electronic circuit comprising: first and second transistors initially biased in a nonconducting state when a first node, coupled to a second transistor, is at a first voltage potential and a second node, coupled to a first transistor, is at a second voltage potential, the first voltage potential being different from the second voltage potential; and altering means, coupled to the first and second nodes and responsive to at least a first control signal, for altering the first and second voltage potentials at the first and second nodes, respectively, and for causing the first and second transistors to be in a conducting state and for accelerating the voltage change at the first and second nodes to final voltage potentials;

wherein the first transistor has a first current flowing terminal coupled to a third voltage potential and a second current terminal coupled to the first node;

wherein the second transistor has a first current flowing terminal coupled to a fourth voltage potential and a second current flowing terminal coupled to the second node; and wherein the third voltage potential is different from the fourth voltage potential.

2. The circuit according to claim 1 wherein the first voltage potential is a low voltage potential, wherein the second voltage potential is a high voltage potential, wherein the third voltage potential is a high voltage potential, and wherein the fourth voltage potential is a low voltage potential.

3. The circuit according to claim 2 wherein the control signal causes the altering means to raise the voltage potential at the first node and to lower the voltage potential at the second node.

4. The circuit according to claim 3 wherein the first transistor has a control terminal coupled to the second node, and wherein the second transistor has a control terminal coupled to the first node.

5. The circuit according to claim 4 wherein the first transistor turns on when the control signal causes the altering means to lower the voltage potential at the second node, and wherein the second transistor turns on when the control signal causes the altering means to raise the voltage potential at the first node.

6. The circuit according to claim 5 wherein the control signal causes the altering means to raise the voltage potential at the first node and to lower the voltage potential at the second node at substantially the same time.

7. The circuit according to claim 6 wherein the control signal causes the altering means to raise the voltage potential at the first node and lowers the voltage potential at the second node in response to the same value of the control signal.

8. The circuit according to claim 7 wherein the altering means comprises:

a third transistor having a first current flowing terminal coupled to the first node, a second current flowing terminal coupled to a high voltage potential, and a control terminal coupled for receiving a first control signal;

a fourth transistor having a first current flowing terminal coupled to the first node, a second current flowing terminal coupled to a high voltage potential, and a control terminal coupled for receiving a second control signal;

a fifth transistor having a first current flowing terminal coupled to the second node, a second current flowing terminal coupled to a low voltage potential, and a control terminal coupled for receiving the first control signal; and a sixth transistor having a first current flowing terminal coupled to the second node, a second current flowing terminal coupled to a low voltage potential, and a control terminal coupled for receiving the second control signal.

9. The circuit according to claim 6 wherein the altering means comprises:

a third transistor having a first current flowing terminal coupled to the first node, a second current flowing terminal coupled to a high voltage potential, and a control terminal coupled for receiving a first control signal;

a fourth transistor having a first current flowing terminal coupled to the first node, a second current flowing terminal coupled to a high voltage potential, and a control terminal coupled for receiving a second control signal;

a fifth transistor having a first current flowing terminal coupled to the second node, a second current flowing terminal coupled to a low voltage potential, and a control terminal coupled for receiving the first control signal; and a sixth transistor having a first current flowing terminal coupled to the second node, a second current flowing terminal coupled to a low voltage potential, and a control terminal coupled for receiving the second control signal.

10. The circuit according to claim 6 wherein the altering means raises the voltage potential at the first node in response to a control signal and lowers the voltage potential at the second node in response to a different value control signal.

11. An electronic circuit comprising:

a first switching element having a first signal terminal and a control terminal;

wherein first switching element signals appear at the first signal terminal of the first switching element in response to signals applied to the control terminal there;

a second switching element having a first signal terminal and a control terminal;

wherein second switching element signals appear at the first signal terminal of the second switching element in response to signals applied to the control terminal thereof;

wherein the control terminal of the first switching element is coupled to the first signal terminal of the second switching element;

wherein the control terminal of the second switching element is coupled to the first signal terminal of the first switching element;

initializing means, coupled to a first selected one of the first signal terminal of the first switching element or the first signal terminal of the second switching element, for initializing the first selected first signal terminal to an initialized signal level; and signal altering means, coupled to a second selected one of the first signal terminal of the first switching element or the first signal terminal of the second switching element, for altering the signal at the second selected first signal terminal;

wherein the first switching element includes a second signal terminal coupled to a first signal level;

wherein the second switching element includes a second signal terminal coupled to a second signal level;

wherein the first signal level is different from the second signal level;

wherein the first switching element communicates current between the first signal terminal and the second signal terminal thereof in response to signals applied to the control terminal thereof; and wherein the second switching element communicates current between the first signal terminal and the second signal terminal thereof in response to signals applied to the control terminal thereof.

12. The circuit according to claim 11 wherein the first signal level is a high signal level, wherein the second signal level is a low signal level.

13. The circuit according to claim 12 wherein the initializing means is coupled to the first signal terminal of the first switching element for initializing the first signal terminal of the first switching element to a low signal level.

14. The circuit according to claim 13 wherein the signal altering means is coupled to the first signal terminal of the first switching element for raising the signal level at the first signal terminal of the first switching element.

15. The circuit according to claim 12 wherein the initializing means is coupled to the first signal terminal of the second switching element for initializing the first signal terminal of the second switching element to a high signal level.

16. The circuit according to claim 15 wherein the signal altering means is coupled to the first signal terminal of the second switching element for lowering the signal level at the first signal terminal of the second switching element.

17. An electronic circuit comprising:

a first switching element having a first signal terminal and a control terminal;

wherein first switching element signals appear at the first signal terminal of the first switching element in response to signals applied to the control terminal of the first switching element;

a second switching element having a first signal terminal and a control terminal;

wherein second switching element signals appear at the first signal terminal of the second switching element in response to signals applied to the control terminal of the second switching element;

wherein the control terminal of the first switching element is coupled to the first signal terminal of the second switching element;

wherein the control terminal of the second switching element is coupled to the first signal terminal of the first switching element;

initializing means, coupled to the first signal terminal of the first switching element and to the first signal terminal of the second switching element, for initializing the first selected first signal terminal of the first switching element to a first signal level and for initializing the first signal terminal of the second switching element to a second signal level; and signal altering means, coupled to the first signal terminal of the first switching element and to the first signal terminal of the second switching element, for altering the signal at the first signal terminal of the first switching element and for altering the signal at the first signal terminal of the second switching element;

wherein the first switching element includes a second signal terminal coupled to a third signal level;

wherein the second switching element includes a second signal terminal coupled to a fourth signal level;

wherein the third signal level is different from the fourth signal level;

wherein the first switching element communicates current between the first signal terminal and the second signal terminal thereof in response to signals applied to the control terminal thereof; and wherein the second switching element communicates current between the first signal terminal and the second signal terminal thereof in response to signals applied to the control terminal thereof.

18. The circuit according to claim 17 wherein the third signal level is a high signal level, and wherein the fourth signal level is a low signal level.

19. The circuit according to claim 18 wherein the initializing means initializes the first signal terminal of the first switching element to a low signal level, and wherein the initializing means initializes the second signal terminal of the second switching element to a high signal level.

20. The circuit according to claim 19 wherein the signal altering means simultaneously alters the signals at the first signal terminal of the first switching element and the first signal terminal of the second switching element.

21. An electronic circuit comprising:

a first transistor having a first current flowing terminal coupled to a first voltage potential and a second current flowing terminal coupled to a first node;

a second transistor having a first current flowing terminal coupled to a second voltage potential and a second current flowing terminal coupled to a second node;

biasing means, coupled to the first and second transistors at the first and second nodes, for initially biasing the first and second transistors in a nonconductive state;

potential altering means, coupled to the first and second node, for altering the voltage potential at the first and second node, respectively; and wherein the second transistor is coupled to the first node so that the second transistor turns on when the voltage potential is altered at the first node;

wherein the first voltage potential is a high voltage potential, and wherein the biasing means initializes the first node to a low voltage potential.

22. The circuit according to claim 21 wherein the potential altering means raises the voltage potential at the first node.

23. The circuit according to claim 22 wherein the second transistor has a control terminal coupled to the first node.

* * * * *